(12) United States Patent
Suda et al.

(10) Patent No.: US 6,787,815 B2
(45) Date of Patent: Sep. 7, 2004

(54) HIGH-ISOLATION SEMICONDUCTOR DEVICE

(75) Inventors: Toshio Suda, Kawasaki (JP); Hidenori Itoh, Kawasaki (JP)

(73) Assignee: NEC Compound Semiconductor Devices, Ltd. (JP)

( * ) Notice: Subject to any disclaimer, the term of this patent is extended or adjusted under 35 U.S.C. 154(b) by 0 days.

(21) Appl. No.: 10/341,698

(22) Filed: Jan. 14, 2003

(65) Prior Publication Data

US 2003/0136967 A1 Jul. 24, 2003

(30) Foreign Application Priority Data

Jan. 18, 2002 (JP) ........................................ 2002-010597

(51) Int. Cl.[7] .............................................. H01L 31/111
(52) U.S. Cl. ...................... 257/107; 257/701; 257/150; 257/178
(58) Field of Search ................................. 257/700, 701, 257/702, 150, 177, 178, 181, 107, 691, 235, 236, 208, 210, 211, 203, 773, 776, 662, 663, 664, 690, 784

(56) References Cited

U.S. PATENT DOCUMENTS

| 5,585,676 | A | * | 12/1996 | Uda et al. | ................... | 257/786 |
| 5,864,975 | A | * | 2/1999 | Alvern | ..................... | 40/299.01 |
| 6,290,532 | B1 | * | 9/2001 | Vermeersch et al. | ......... | 439/460 |
| 2002/0118528 | A1 | * | 8/2002 | Su et al. | ...................... | 361/800 |

FOREIGN PATENT DOCUMENTS

JP          02019890 A  *  1/1990  ............. G09F/9/30

* cited by examiner

*Primary Examiner*—Nathan J. Flynn
*Assistant Examiner*—Pershelle Greene
(74) *Attorney, Agent, or Firm*—Hayes Soloway P.C.

(57) ABSTRACT

A switching device for switching a plurality of RF signal lines to deliver a selected one of the RF signals to a receiver has an isolation D/U characteristic as high as 40 dB or higher. The switching device includes a mounting board made of dielectric and a matrix switch mounted thereon and implemented by one or more of SWIC. The RF signal lines in the switching device has no crossing point therebetween on either side of the mounting board to achieve the high isolation D/U ratio or lower cross-talk.

13 Claims, 7 Drawing Sheets

FIG. 7 PRIOR ART
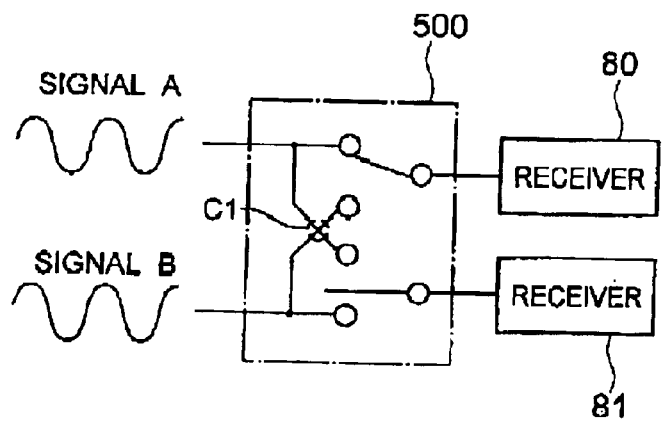
FIG. 8A
PRIOR ART
FIG. 8B
PRIOR ART
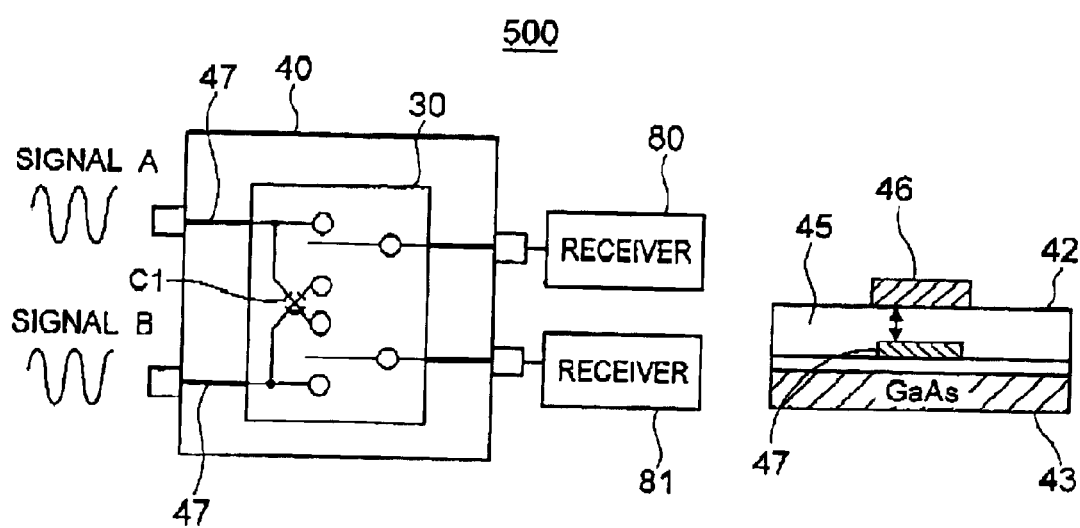

FIG. 9A
PRIOR ART
FIG. 9B
PRIOR ART
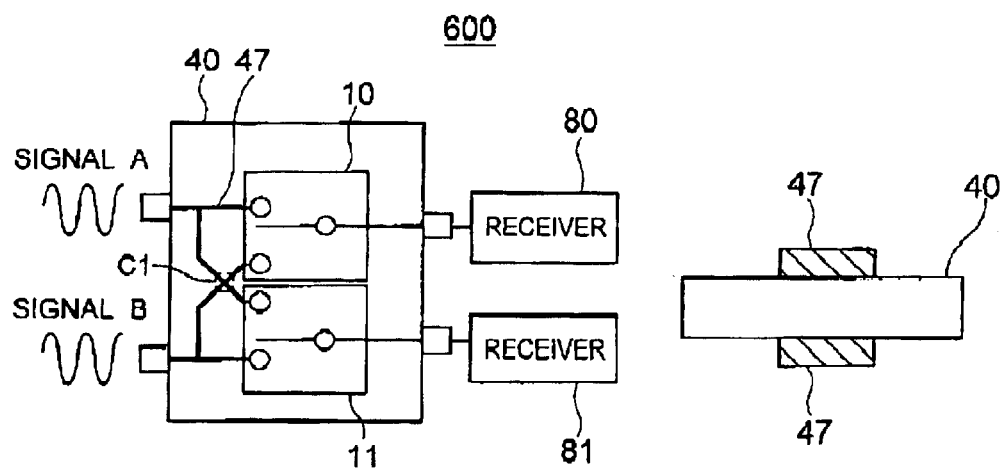
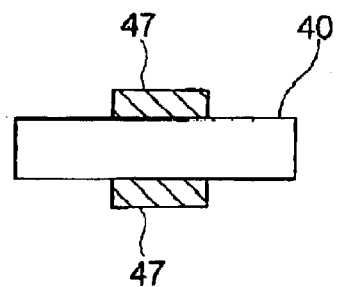
FIG. 10A
PRIOR ART
FIG. 10B
PRIOR ART
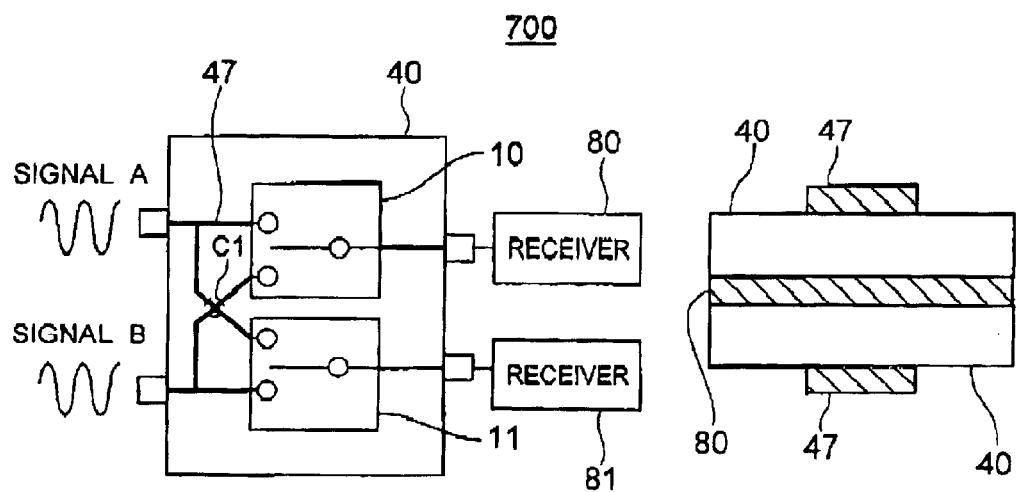
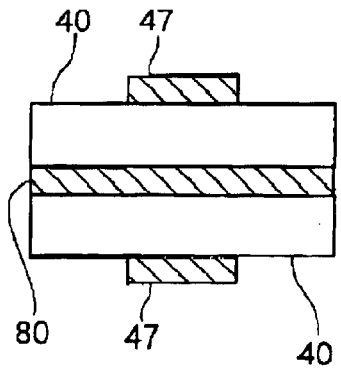

HIGH-ISOLATION SEMICONDUCTOR DEVICE

BACKGROUND OF THE INVENTION (a) Field of the Invention

The present invention relates to a high-isolation semiconductor device and, more particularly, to a high-isolation semiconductor device suitable for use in a satellite television receiver.

(b) Description of the Related Art

In recent years, satellite-broadcasting systems are widely spread among a large number of households, and thus the number of satellites used for the satellite-broadcasting systems is increasing. In a satellite broadcasting receiver system for receiving the multiple-channel programs, a switching device is often used for switching a plurality of high-frequency signals, or radio-frequency signals (RF signals), supplied through respective channels to deliver a selected one of the RF signals to each of a plurality of receivers. The switching device for the RF signals is generally implemented by a matrix switch having a plurality of inputs and a plurality of outputs, wherein a selected one of the inputs can be coupled to each of the outputs.

FIG. 7 shows a typical circuit configuration of a switching device 500 for receiving two input RF signals, signal A and signal B, to deliver a selected one of the input signals to each of two receivers 80 and 81. The switching device 500 is implemented by a 2×2 matrix switch having two inputs and two outputs, or two SPDT (single-pole-double-throw) switches. Each of the receivers 80 and 81 is connected to a corresponding output terminal of the switching device 500 to receive one of the RF signals, signal A and signal B, independently of each other.

The matrix switches incorporated in a communication SWIG or communication LSI are generally implemented by transistors, such as a junction PET, or a pin-junction photodiode The communication SWICs, for example, include a SPDT SWIC having a plurality of separate SPDTs which are the minimum switch units, and a twin-SWIC having a plurality of SPDT pairs, each pair being connected in parallel. The SWIC is mounted on a mounting board having a dielectric substrate and patterned interconnections formed on top and bottom surfaces of the dielectric substrate. In an alternative, the twin-SWIC, for example, may include interconnections therein and may be received in a package together with the interconnections.

The performance of a matrix switch with respect to the isolation characteristic is estimated by an isolation D/U (desired-to-undesired) ratio of each signal line receiving a desired output signal, which is calculated by the power ratio of the desired signal component to the undesired signal component, both the components being included in the output signal. It is desired that transmitters and receivers used in the up-to-date satellite broadcasting system have an isolation D/U ratio as high as 40 dB or above.

The isolation D/U ratio as high as 40 dB or above can be achieved in a SWIC itself as a separate unit by suitably selecting the constituent elements, circuit configuration, circuit constants and layout pattern of the SWIC. However, since a plurality of SWICs are connected together by signal lines for achieving a matrix switch having a plurality of inputs and a plurality of outputs, there are crossing points between these signal lines which transmit the RF signals. This makes it difficult to achieve a high isolation D/U ratio with respect to the signal lines, whereby the switching device cannot achieve a higher isolation characteristic as a whole. In the example shown in FIG. 7, the signal line for transmitting the signal A and the signal line for transmitting the signal B cross each other at the crossing point C1, wherein the signal leakage arises therebetween to degrade the isolation D/U ratio of the signal lines.

As described above, a 2×2 matrix switch, for example, is generally implemented by mounting a plurality of SPDT SWICs or twin-SWICs on a mounting board having patterned interconnections or mounting a single 2×2 matrix SWIC on such a mounting board. In the former case, a crossing point arises between RF signal lines on the mounting board, whereas in the latter case, a crossing point arises between RF signal lines within the 2×2 matrix SWIC. In either case, the signal leakage should be suppressed by enlarging the distance between the RF signal lines and/or reducing the projected area of the opposing RF signal lines at the crossing point.

FIG. 8A is the top plan view of a switching device implemented by a single SWIC including a 2×2 matrix switch, whereas FIG. 8B is the sectional view of the crossing point shown in FIG. 8A. The switching device includes RF signal lines which include a plated signal line 46 plated with gold and overlying a dielectric film (oxide film) 42, and a metallic signal line 47 underlying the dielectric film 42, wherein the signal lines 46 and 47 oppose each other at the crossing point C1 with an intervention of the dielectric film 42.

The dielectric film 42 has a small thickness on the order of micrometers, whereby the distance between the RF signal lines 46 and 47 is small and a large cross-talk may arise therebetween. Assuming that the projected area of the opposing RF signal line is around a several-micrometer square, the level of the cross-talk between the RF signal lines is around 30 dB, which is not negligible for the switching device.

FIGS. 9A and 9B show, similarly to FIGS. 8A and 8B, another conventional switching device 600 implemented by two SWICs 10 and 11 each including SPDT switch and mounted on a common mounting board 40. In this example, metallic signal lines 47 oppose each other with an intervention of the mounting board 40 having a thickness of around 1 mm or below.

In the example shown in FIGS. 9A and 9B, since the RF signal lines 47 on the mounting board 40 have a characteristic impedance of 50 Ω, the RF signal lines 47 have a width of around 1 mm, assuming that the mounting board 40 has a dielectric constant $\epsilon$ of 3.38 and a thickness of 0.51 mm, for example. This may cause a significant cross-talk level between the RF signal lines 47, e.g., an isolation D/U ratio around 30 dB with respect to the RF signal lines 47. In addition, if the mounting board 40 has a micro-strip line structure, there arises a mismatching of the characteristic impedance due to the fact that a ground plane cannot be provided at the crossing point C1 on the surface of the mounting board 40 opposite to the surface on which the subject RF signal line 47 is formed.

FIGS. 10A and 10B show, similarly to FIGS. 8A and 8B, another conventional switching device 700 implemented by two SWICs 10 and 11 each including SPDT switch and mounted on a common mounting board, which includes a pair of dielectric substrates 40 and a ground plane 80 sandwiched therebetween. In this example, RF signal lines 47 oppose each other with an intervention of the mounting board including the ground plane 80 and the dielectric substrates 40. This structure allows significant reduction of the cross-talk level between the RF signal lines 47 and suppresses the mismatching of the characteristic impedance. However, the mounting board has a larger thickness and the fabrication cost thereof is higher.

FIG. 11 is a top plan view of another conventional switching device 800 implemented by a twin-SWIC 20. In this example, a semi-rigid cable 50 is used as a part of one of the RF signal lines 47 and raised from the mounting board 40 at the crossing point C1. This structure reduces the cross-talk between the RF signal lines 47; however, the junction for connecting the signal line 47 on the mounting board 40 and the semi-rigid cable 50 causes miss-matching of the characteristic impedance and thus degrades the signal characteristics, such as a return loss. In addition, arrangement of the semi-rigid cable 50 above the mounting board 40 raises the costs for the switching device 800.

As described above, the conventional techniques for the switching device do not achieve a high isolation D/U ratio in the switching device without involving the miss-matching of the characteristic impedance and/or raising the fabrication costs.

SUMMARY OF THE INVENTION

In view of the above, it is an object of the present invention to provide a semiconductor device including a switching device, wherein a higher isolation D/U ratio is achieved at a crossing point between the signal lines substantially without causing miss-matching of the characteristic impedance of the signal lines and without raising the fabrication costs of the semiconductor device.

The present invention provides a semiconductor device including at least one integrated circuit (IC) and a mounting board having a top surface for mounting thereon the IC at a bottom surface of the IC, the mounting board including a dielectric substrate, first and second input lines formed on the dielectric substrate for transferring first and second input signals, respectively, to the IC, and first and second output lines formed on the dielectric substrate for transferring first and second output signals, respectively, generated by the IC based on the first and second input signals, wherein the mounting board has no crossing point between the first input line and the second input line on either side of the dielectric substrate.

In accordance with the semiconductor device of the present invention, the absence of the crossing point on either side of the mounting board reduces the cross-talk between the first input line and the second input line, whereby the semiconductor device has a higher isolation characteristic.

The above and other objects, features and advantages of the present invention will be more apparent from the following description, referring to the accompanying drawings.

BRIEF DESCRIPTION OF THE DRAWINGS

FIG. 7 is a Circuit diagram of a typical switching device.

FIG. 8A is a top plan view of a conventional switching device, and FIG. 8B is a sectional view of the crossing point in the switching device of FIG. 8A.

FIG. 9A is a top plan view of another conventional switching device, and FIG. 9B is a sectional view of the crossing point in the switching device of FIG. 9A.

FIG. 10A is a top plan view of another conventional switching device, and FIG. 10B is a sectional view of the crossing point in the switching device of FIG. 10A.

PREFERRED EMBODIMENTS OF THE INVENTION

Figures 1A, 1B:
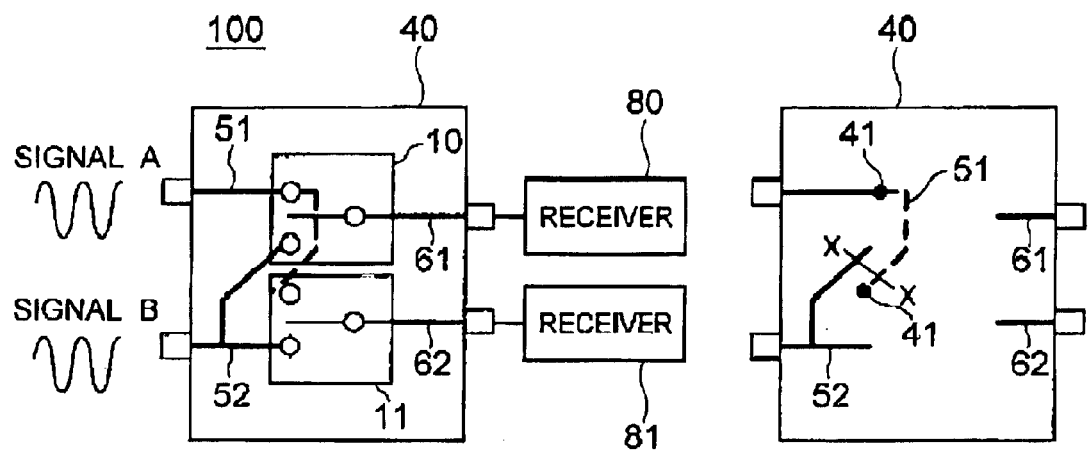
FIG. 1A is a top plan view of a switching device according to a first embodiment of the present invention.
FIG. 1B is a top plan view of the mounting board shown in FIG. 1A.

Now, the present invention is more specifically described with reference to accompanying drawings, wherein similar constituent elements are designated by similar reference numerals throughout the drawings.

Referring to FIGS. 1A and 1B, a switching device, generally designated by numeral 100, according a first embodiment of the present invention includes a mounting board 40 made of insulator substrate and including therein patterned signal lines 51, 52, 61 and 62, and a matrix switch implemented by a pair of SPDT SWICs 10 and 11 mounted on the mounted board 40. The signal lines shown by solid lines are formed on the top surface of the dielectric substrate, wherein the signal line shown by a dotted line is formed on the bottom surface of the dielectric substrate.

The switching device 100 receives at the inputs thereof RF signals, or signal A and signal B, to deliver one of the RF signals to each of receivers 80 and 81 via signal lines 51, 52, 61 and 62 and SPDT SWICs 10 and 11. That is, the receivers 80 and 81 receive one of the signals A and B independently of each other by the function of the switching device., SPDT SWIC 10 switches the RF signals for receiver 80, whereas SPDT SWIC 11 switches the RF signals for receiver 81. The signal lines 51 and 52 are patterned on the mounting board 40 so that the signal lines 51 and 52 have no crossing point therebetween on each of the top and bottom surfaces of the insulator substrate 40. For this purpose, through-holes 41 penetrate the mounting board 40 to connect a portion of the signal line 51 formed on the top surface of the mounting board 40 to another portion of the signal line 51 formed on the bottom surface. As understood from FIG. 1A, at the input side of the SWICs 10 and 11, the RF signal lines are arranged in the order of signal line 51, signal line 52, signal line 51 and signal line 52. This arrangement is employed because the distance between the signal lines 51 and 52 can be secured to a desired extent by sufficiently separating the SWICs 10 and 11 from each other.

Figure 2:
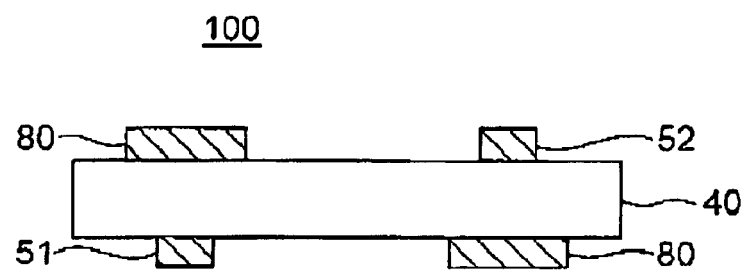
FIG. 2 is a sectional view taken along line II—II in FIG. 1B.

Referring to FIG. 2 taken along line X—X in FIG. 1B, ground conductors 80 each configuring a ground plane are formed on the top and bottom surfaces of the mounting board 40 so as to oppose the signal lines 51 and 52, respectively, formed on the bottom and top surface of the mounting board 40. That is, the configuration of the present embodiment wherein there is no crossing point on either surface of the mounting board 40 allows all the signal lines 51, 52, 61 and 62 to be associated with ground conductors 80 formed on the opposite surface of the mounting board 40.

Figure 3:
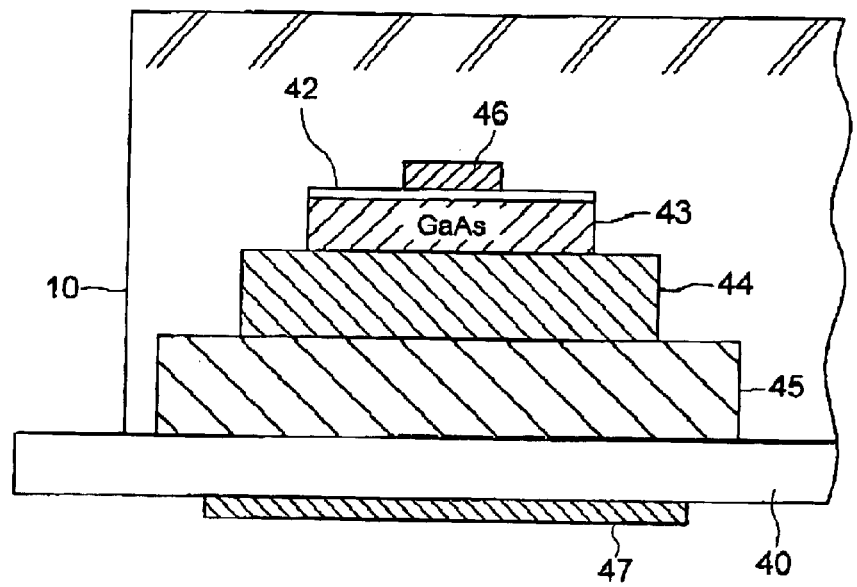
FIG. 3 is a conceptual sectional view of the switching device of FIG. 1.

Referring to FIG. 3, in the switching device of FIG. 1, the SPDT SWICs 10 and 11 are encapsulated in a mold resin 45 which is mounted on the top surface of the mounting board 40. A lead frame 44 is interposed between the mold resin 45 and a GaAs substrate 43, on which signal amplifiers etc. are formed for processing the RF signals. The plated signal lines 46 plated with gold and connected to the GaAs substrate 43 are disposed on a dielectric film 42 formed on the GaAs substrate 43. The metallic signal lines 47 formed on the bottom surface of the mounting board 40 oppose the plated signal lines 46 on the dielectric film 42 with an intervention of the dielectric film 42, GaAs substrate 43, lead frame 44, mold resin 45 and mounting board 40, whereby the distance between the signal lines 47 and the signal lines 46 is on the order of millimeters, and thus is sufficient for suppressing the cross-talk therebetween. The signal line 46 is also disposed sufficiently apart from other signal lines formed on the top surface of the mounting board 40. Since the signal lines formed within the SPDT SWICs have a smaller width, the cross-talk between the signal lines in the SWICs is smaller due to the smaller opposing area.

The switching device 100 of the present embodiment has an isolation D/U ratio as high as 40 dB or higher, and thus the cross-talk between the signal line 51 and the signal line 52 in FIG. 1 can be suppressed to a suitable level. In addition, these signal lines 51, 52, 61 and 62 can be formed in a micro-strip line structure, whereby excellent impedance matching can be obtained therein. Further, since these signal lines can be formed by a photographic patterning technique, an additional material or an additional assembly process is not needed, which reduces the fabrication costs for the switching device 100.

Figures 4A, 4B:
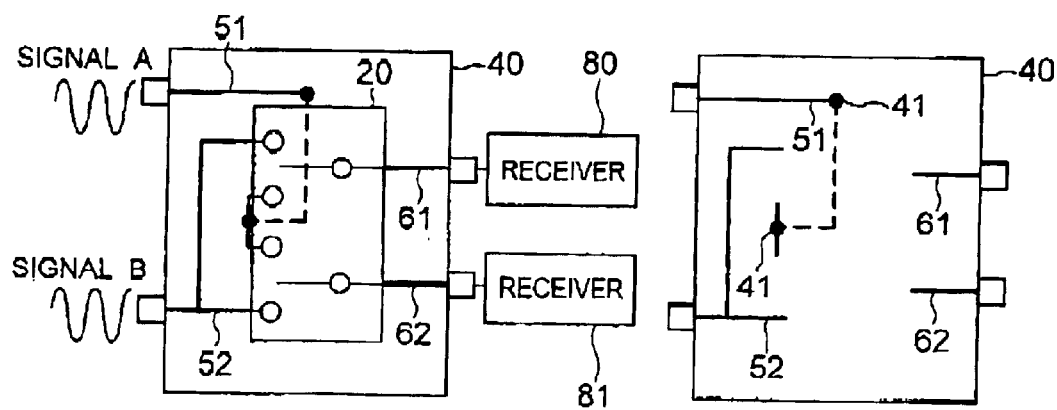
FIG. 4A is a top plan view of a switching device according to a second embodiment of the present invention.
FIG. 4B is a top plan view of the mounting board shown in FIG. 4A.

Referring to FIGS. 4A and 4B, a switching device, generally designated by numeral 200, according to a second embodiment of the present invention is implemented by a matrix switch formed by a twin-SWIC 20 including two SPDT switches therein.

In the present embodiment, the single IC 20 employed reduces the man-hours for fabrication. The RF signal lines are arranged at the input side of the SWIC 20 in the order of signal line 52, signal line 51, signal line 51 and signal line 52. This arrangement is employed for reducing the cross-talk between the signal lines 51 and 52 to achieve a higher isolation D/U ratio in the case of the single IC 20. The signal line 51 has a portion formed on the bottom surface of the mounting board 40 for avoiding occurrence of a crossing point on the top surface of the mounting substrate 40.

Figure 5A:
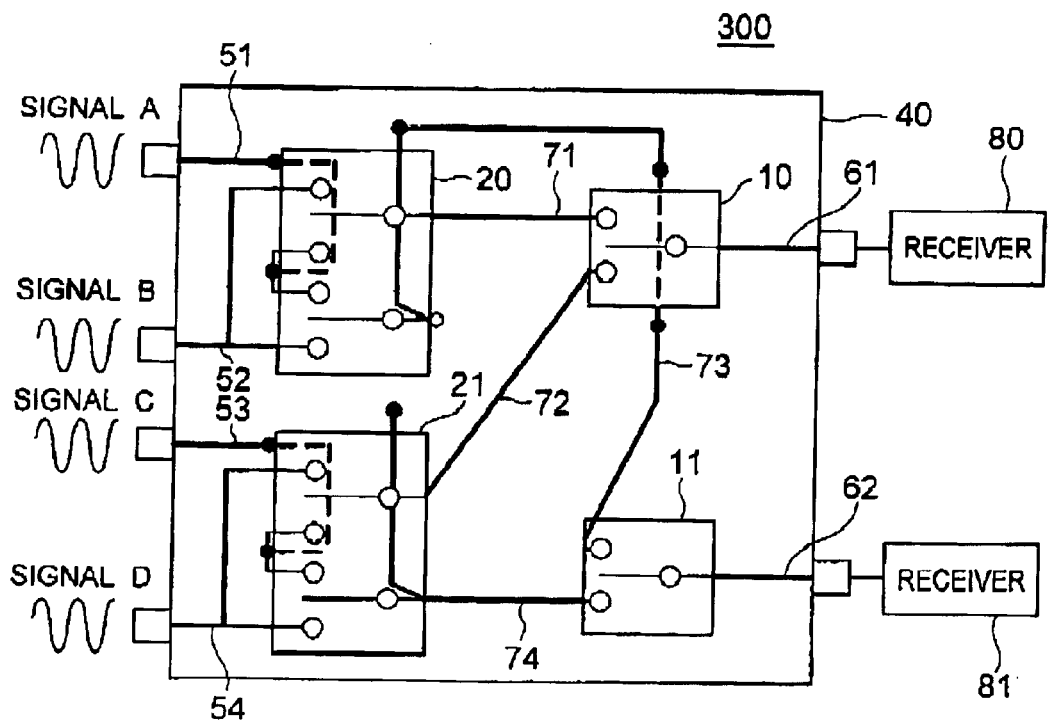
FIG. 5A is a top plan view of a switching device according to a third embodiment of the present invention.
Figure 5B:
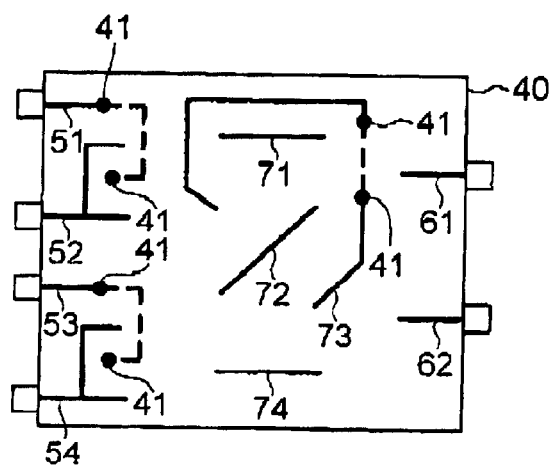
FIG. 5B is a top plan view of the mounting board shown in FIG. 5A.

Referring to FIGS. 5A and 5B, a switching devices generally designated by numeral 300, according to a third embodiment of the present invention receives four RP signals, signal A to signal D to deliver a selected one of the RF signals to each of two receivers 80 and 81. The switching device 300 is implemented by a pair of twin-SWICs 20 and 21 and a pair of SPDT SWICs 10 and 11, all of which are mounted on a single mounting board 40.

Twin SWIC 20 selects one of the signals A and B received via signal lines 51 and 52, respectively, and delivers the selected signal to a first input of each of the SPDT SWICs 10 and 11 via a signal line 71 or 73. Twin SWIC 21 selects one of the signals C and D received via signal lines 53 and 54, respectively, and delivers the selected signal to a second input of each of the SPDT SWICs 10 and 11 via a signal line 72 or 74. Each of the SPDT SWICs 10 and 22 selects the RF signal received at the first input or the second input to deliver the selected RF signal to a corresponding receiver 80 or 81. Thus, each of the receivers 80 and 81 independently receives any one of the RE signals A to D by the function of the switching device 300.

The arrangement of the signal lines 51 and 52 as well as the arrangement of the signal lines 53 and 54 on the mounting board 40 shown in FIG. 5B is similar to the arrangement of the signal lines 51 and 52 shown in FIG. 4B The signal lines 71 to 74 are arranged so that these signal lines 71 to 74 do not have a crossing point therebetween on either surface of the mounting board 40, as shown in FIG. 5B This allows a higher isolation D/U ratio, as well.

Figure 6A:
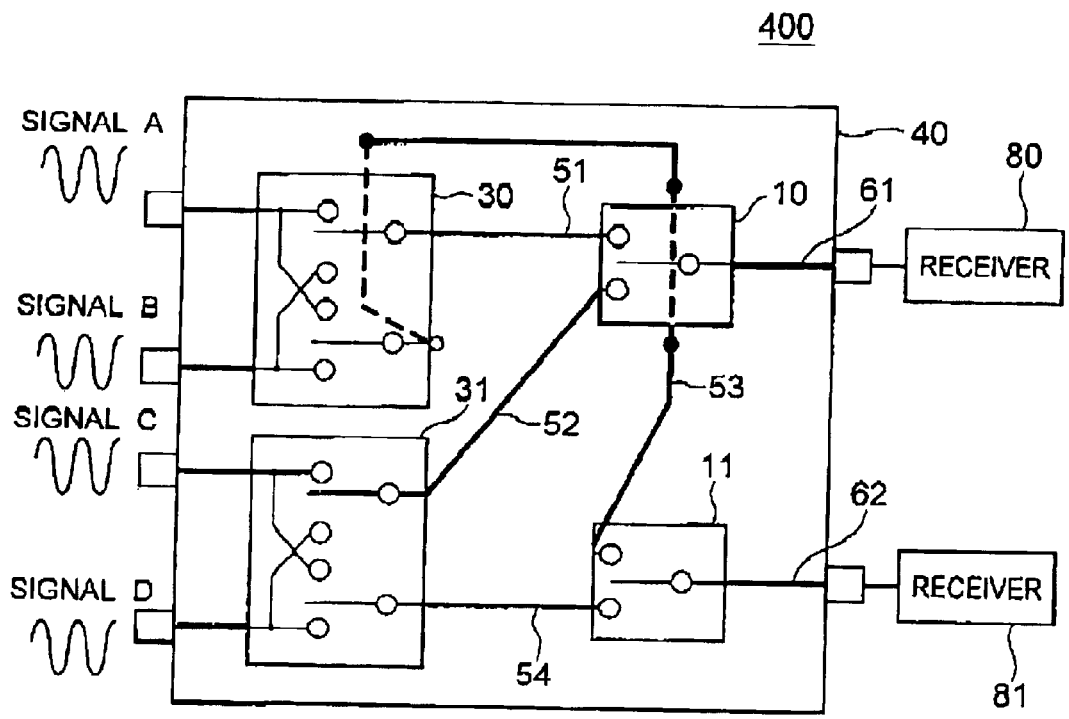
FIG. 6A is a top plan view of a switching device according to a fourth embodiment of the present invention.
Figure 6B:
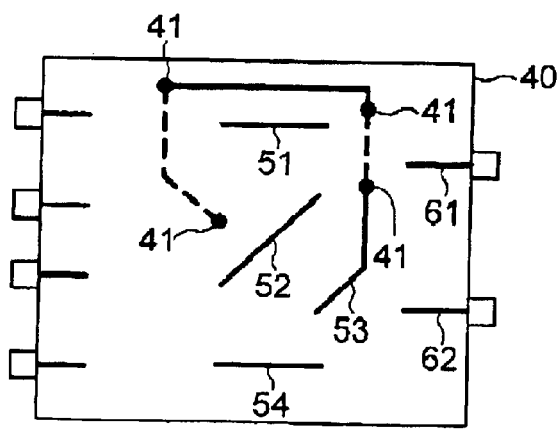
FIG. 6B is a top plan view of the mounting board shown in FIG. 6A.
Figure 11:
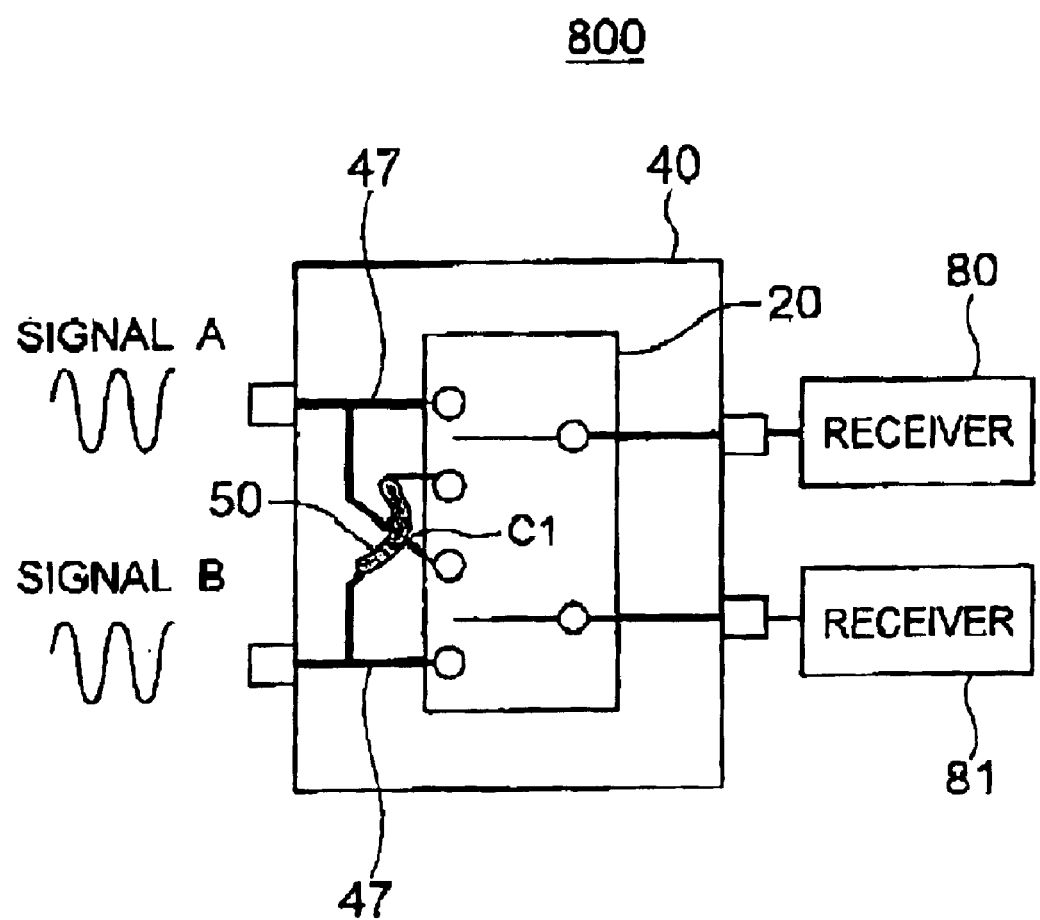
FIG. 11 is a top plan view of another conventional switching device.

Referring to FIGS. 6A and 6B, a switching device, generally designated by numeral 400, according to a fourth embodiment of the present invention includes a matrix switch implemented by a pair of 2×2 SWICs 30 and 31 and a pair of SPDT SWICs 10 and 11, all of which are mounted on a mounting board 40.

In the switching device 400 of the present embodiment, the 2×2 SWICs 30 31 have therein a crossing point between the RF signal lines. Thus, the signal lines in the 2×2 SWICs 30 and 31 have a lower isolation D/U ratio, due to the cross-talk between signal A and signal B as well as between signal C and signal D in the illustrated example. On the other hand, the signal lines 51 to 54 disposed between the 2×2 SWICs 30 and 31 and the SPDT SWICs 10 and 11 have isolation D/U ratios as high as 40 dB or higher due to absence of the crossing point between these signal lines 51 to 54.

More specifically, the isolation characteristic between signal A and signal B as well as signal C and signal D is lower, for example, at around 30 dB for the isolation D/U ratio, whereas the isolation characteristic between signal A or B and signal C or D is higher, for example, as high as 40 dB or higher for the isolation D/U ratio. In the present embodiment, a specific signal line has a desired higher isolation characteristic, and another signal line has a lower isolation characteristic based on the design of the switching device 400.

In the above embodiments, preferred switching devices are exemplified; however, the present invention can be applied to other specific devices such as an amplifier, driver etc. incorporated in a semiconductor device, which are requested to have a higher isolation characteristic. The semiconductor devices to which the present invention is suitably applied include a MMIC operating at a high frequency, such as Ku to Ka bands or a higher frequency range, and having a higher signal transmission loss therein. In such a semiconductor device, the impedance matching of the RF signal lines is important.

In general, a typical SWIC for RE signals includes a ground plane at the bottom thereof for achieving the impedance matching and the isolation characteristic. Thus, in the switching devices of the above embodiments, some signal lines are disposed on the bottom surface of the mounting board. However, if the SWIC does not have such a ground plane, the RF signal lines may be disposed on the top surface of the mounting board, i.e., between the mounting board and the SWIC.

Since the above embodiments are described only for examples, the present invention is not limited to the above embodiments and various modifications or alterations can be easily made therefrom by those skilled in the art without departing from the scope of the present invention.

What is claimed is:

1. A semiconductor device comprising at least one integrated circuit (IC) and a mounting board having a top surface for mounting thereon said IC at a bottom surface of said IC, said mounting board having a dielectric substrate, first and second input lines formed on said dielectric substrate for transferring first and second input signals, respectively, to said IC, and first and second output lines formed on said dielectric substrate for transferring first and second output signals, respectively, generated by said IC based on said first and second input signals, wherein:

said dielectric substrate has no crossing point between said first input line and said second input line, wherein each of said first and second output lines has an isolation D/U ratio of 40 dB or above with respect to said first output signal and said second output signal.

2. The semiconductor device according to claim 1, wherein said dielectric substrate has no crossing point between said first output line and said second output line, between said first input line and said first and second output lines, and between said second input line and said first and second output lines.

3. The semiconductor device according to claim 1, wherein said at least one IC includes a first IC for receiving said first and second input signals to output said first output signal, and a second IC for receiving said first and second input signals to output said second output signal.

4. The semiconductor device according to claim 3, wherein said first IC includes a first single-pole-double-throw (SPDT) switch, and said second IC includes a second SPDT switch.

5. The semiconductor device according to claim 3, wherein at least one of said first and second input lines and said first and second output lines passes beneath said bottom surface said first or second IC.

6. The semiconductor device according to claim 4, wherein each of said first and second SPDT switches is a junction FET or pin-junction photodiode.

7. The semiconductor device according to claim 1, wherein a portion of said first input line and at least a portion of said second input line are formed on top and bottom surfaces, respectively, of said dielectric substrate.

8. The semiconductor device according to claim 7, wherein said mounting board includes first and second ground planes opposing said at least a portion of said first input line and said at least a portion of said second input line, respectively.

9. The semiconductor device according to claim 1, wherein said first and second input signals are satellite broadcasting signals, and said first and second output lines are connected to first and second receivers, respectively.

10. The semiconductor device according to claim 1, wherein said at least one IC includes a single IC having therein a pair of single-pole-double-throw (SPDT) switches.

11. The semiconductor device according to claim 1, wherein said IC includes third and fourth input lines connected to said first and second input lines, respectively, and third and fourth output lines connected to said first and second output lines, and there is no crossing point between said third input line and said fourth input line and between said third output line and said fourth output line.

12. The semiconductor device according to claim 11, further comprising another at least one IC having first and second output terminals connected to said first and second input lines, respectively.

13. The semiconductor device according to claim 1, wherein a portion of said first input line and at least a portion of said second input line are formed on top and bottom surfaces, respectively, of the mounting board.

* * * * *